United States Patent
Nakayama et al.

(10) Patent No.: US 11,955,959 B2
(45) Date of Patent: Apr. 9, 2024

(54) PARALLEL DRIVING DEVICE AND POWER CONVERSION DEVICE

(71) Applicant: Mitsubishi Electric Corporation, Tokyo (JP)

(72) Inventors: Yasushi Nakayama, Tokyo (JP); Yoshiko Tamada, Tokyo (JP); Takayoshi Miki, Tokyo (JP); Shota Morisaki, Tokyo (JP); Yukio Nakashima, Tokyo (JP); Kenta Uchida, Tokyo (JP); Keisuke Kimura, Tokyo (JP); Tomonobu Mihara, Tokyo (JP)

(73) Assignee: MITSUBISHI ELECTRIC CORPORATION, Tokyo (JP)

( * ) Notice: Subject to any disclaimer, the term of this patent is extended or adjusted under 35 U.S.C. 154(b) by 340 days.

(21) Appl. No.: 17/613,697

(22) PCT Filed: May 29, 2019

(86) PCT No.: PCT/JP2019/021404
§ 371 (c)(1),
(2) Date: Nov. 23, 2021

(87) PCT Pub. No.: WO2020/240744
PCT Pub. Date: Dec. 3, 2020

(65) Prior Publication Data
US 2022/0231595 A1    Jul. 21, 2022

(51) Int. Cl.
*H03K 17/14* (2006.01)
*H03K 17/04* (2006.01)
(Continued)

(52) U.S. Cl.
CPC ............ *H03K 17/14* (2013.01); *H03K 17/04* (2013.01); *H03K 17/0412* (2013.01); *H03K 17/28* (2013.01); *H02M 1/088* (2013.01)

(58) Field of Classification Search
None
See application file for complete search history.

(56) References Cited

U.S. PATENT DOCUMENTS 5,952,869 A      9/1999  Fattori et al.
10,090,832 B2 *  10/2018  Hayashi ............... H03K 17/127
(Continued)

FOREIGN PATENT DOCUMENTS

CN    108574449 A    9/2018
JP    H1079654 A     3/1998
(Continued)

OTHER PUBLICATIONS

International Search Report (PCT/ISA/210) with translation and Written Opinion (PCT/ISA/237) dated Aug. 6, 2019, by the Japan Patent Office as the International Searching Authority for International Application No. PCT/JP2019/021404. (11 pages).
(Continued)

*Primary Examiner* — Cassandra F Cox
(74) *Attorney, Agent, or Firm* — BUCHANAN INGERSOLL & ROONEY PC

(57) ABSTRACT

A parallel driving device that drives parallel-connected semiconductor elements includes a control unit and a gate driving circuit. The control unit detects a temperature difference between the semiconductor elements on the basis of detected values by temperature sensors that detect temperatures of the individual semiconductor elements. The control unit generates a control signal for changing the timing at which to turn on a first semiconductor element specified from the semiconductor elements on the basis of the temperature difference. The gate driving circuit generates a first driving signal for driving the semiconductor elements, and generates a second driving signal that is the first driving
(Continued)

signal delayed on the basis of the control signal, and applies the second driving signal to the first semiconductor element.

7 Claims, 8 Drawing Sheets

(51) Int. Cl.
*H03K 17/0412* (2006.01)
*H03K 17/28* (2006.01)
*H02M 1/088* (2006.01)

(56) References Cited

U.S. PATENT DOCUMENTS

| | | | |
|---|---|---|---|
| 10,305,364 B1 * | 5/2019 | Goto | ........................ H02M 1/08 |
| 10,951,106 B2 | 3/2021 | Akiyama | |
| 11,187,597 B2 * | 11/2021 | Kurokawa | ............ H02M 1/088 |
| 2018/0269804 A1 | 9/2018 | Mizukami | |
| 2019/0383670 A1 * | 12/2019 | Sathik | ..................... H02P 29/60 |

FOREIGN PATENT DOCUMENTS

| | | | |
|---|---|---|---|
| JP | 2009159662 A | 7/2009 |
| JP | 2014086853 A | 5/2014 |
| JP | 2016149632 A | 8/2016 |
| JP | 2017055259 A | 3/2017 |
| JP | 2018050433 A | 3/2018 |

OTHER PUBLICATIONS

Office Action dated Dec. 14, 2021, issued in corresponding Japanese Patent Application No. 2021-521663, 9 pages including 7 pages of English Translation.
Office Action dated May 5, 2022, issued in corresponding Indian Patent Application No. 202127053915, 5 pages.

\* cited by examiner

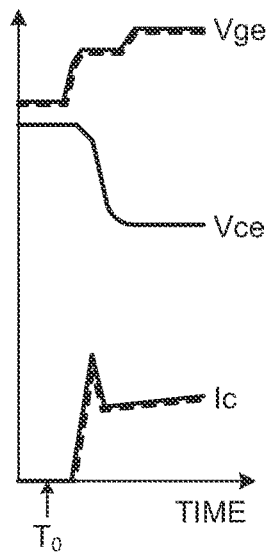 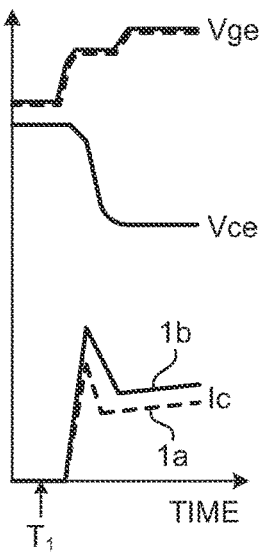 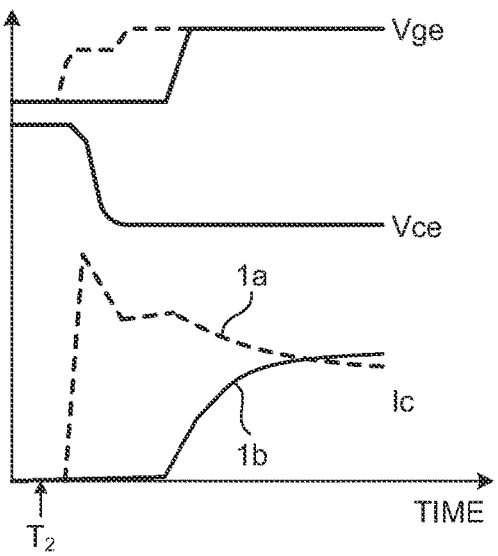
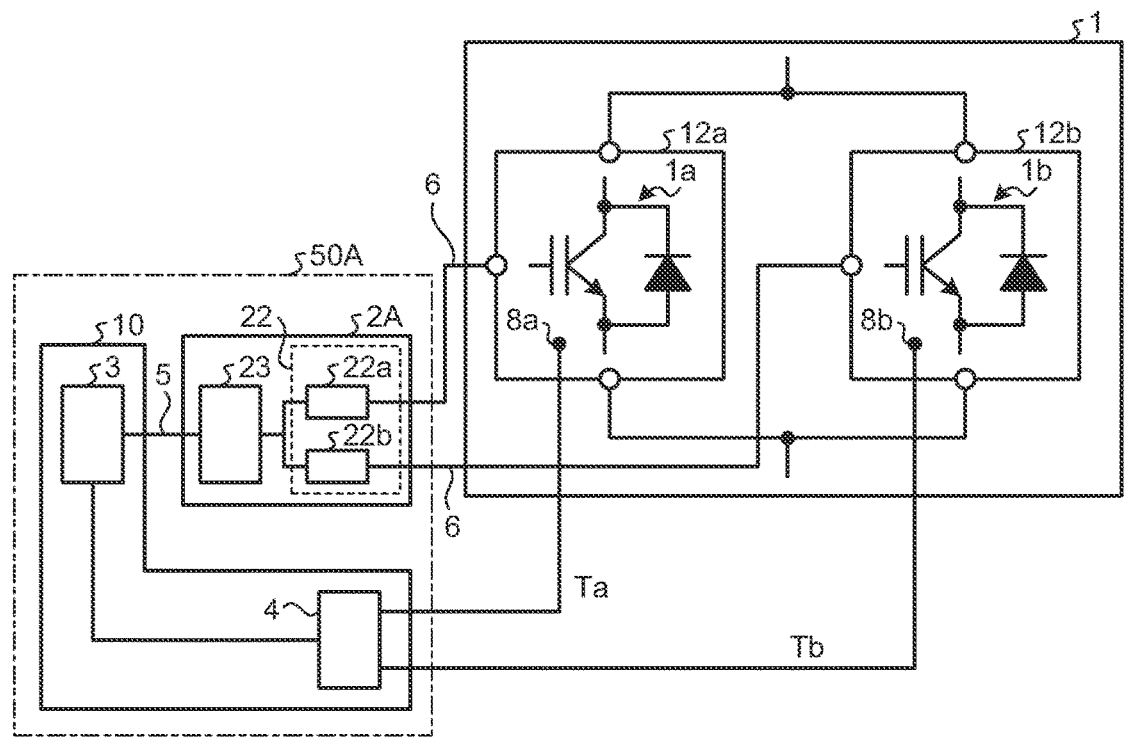

PARALLEL DRIVING DEVICE AND POWER CONVERSION DEVICE

FIELD

The present invention relates to a parallel driving device that drives a circuit having a plurality of parallel-connected power semiconductor elements (hereinafter, appropriately abbreviated as "semiconductor element(s)"), and also relates to a power conversion device including the parallel driving device.

BACKGROUND

For parallel-connected semiconductor elements, currents flowing through the individual semiconductor elements are not equal to one another during the operation of an inverter because of a variation in characteristic among the semiconductor elements, or in wiring between the parallel-connected semiconductor elements. In this case, a loss in each of the semiconductor elements causes a temperature imbalance between the semiconductor elements. As a result, a particular semiconductor element becomes high in temperature. If this state continues, the thermal cycle life of the semiconductor element is shortened, thereby making it highly likely that the particular semiconductor element fails in the worst case.

To solve the above problem, Patent Literature 1 described below discloses a technique of alternate control that selects an on-duty element and an off-duty element from a plurality of semiconductor elements and periodically alternates a driving signal between the on-duty element and the off-duty element, such that the imbalance of loads on the semiconductor elements used in parallel are eliminated to equalize the loads, thereby preventing the degradation of a particular semiconductor element. In Patent Literature 1, the word "loads" included in the term "imbalance of loads" is not used to mean "targets to be supplied with power", but is used to mean "damage".

CITATION LIST

Patent Literature

Patent Literature 1: Japanese Patent Application Laid-open No. 2017-55259

SUMMARY

Technical Problem

The technique disclosed in Patent Literature 1 described above can eliminate the imbalance of loads on the semiconductor elements to equalize the loads.
Unfortunately, the alternate control that periodically alternates the on-duty element and the off-duty element, as described in Patent Literature 1, fails to maintain the temperature balance between the semiconductor elements.

For the technique disclosed in Patent Literature 1, the on-duty element and the off-duty element are alternately driven without being driven simultaneously. Given that a conduction loss in a semiconductor element is in proportion to the square of the current flowing through the semiconductor element, driving the on-duty element and the off-duty element simultaneously provides a smaller conduction loss. When the technique disclosed in Patent Literature 1 is applied, thus, there is a problem of increase in a loss in each individual semiconductor element.

The present invention has been achieved to solve the above problems, and an object of the present invention is to provide a parallel driving device that, when driving a plurality of semiconductor elements in parallel, can minimize an increase in loss in a semiconductor element, and can also maintain the temperature balance between the semiconductor elements.

Solution to Problem

In order to solve the above problems and achieve the object, the present invention is a parallel driving device to drive a plurality of semiconductor elements connected in parallel. The parallel driving device includes a control unit and a driving circuit. The control unit detects a temperature difference between the semiconductor elements on the basis of detected values provided by temperature sensors that detect temperatures of the individual semiconductor elements. The control unit generates a control signal for changing a timing at which to turn on a first semiconductor element specified from the semiconductor elements on the basis of the temperature difference. The driving circuit generates a first driving signal for driving the semiconductor elements, and generates a second driving signal that is the first driving signal delayed on a basis of the control signal, and applies the second driving signal to the first semiconductor element.

Advantageous Effects of Invention

The parallel driving device according to the present invention has an effect of minimizing an increase in loss in the semiconductor element and also maintaining the temperature balance between the semiconductor elements when driving the semiconductor elements in parallel.

BRIEF DESCRIPTION OF DRAWINGS

FIG. 4A shows waveform diagrams illustrating the operating state of the semiconductor elements at one point of the time chart illustrated in FIG. 3.

FIG. 4B shows waveform diagrams illustrating the operating state of the semiconductor elements at another point of the time chart illustrated in FIG. 3.

FIG. 4C shows waveform diagrams illustrating the operating state of the semiconductor elements at still another point of the time chart illustrated in FIG. 3.

FIG. 5 is a diagram illustrating a detailed configuration of a parallel driving device according to a second embodiment along with the semiconductor elements that are targets to be driven.

DESCRIPTION OF EMBODIMENTS

A parallel driving device and a power conversion device according to embodiments of the present invention will be described in detail below with reference to the accompanying drawings. The present invention is not limited to the embodiments described below.

First Embodiment

Figure 1:
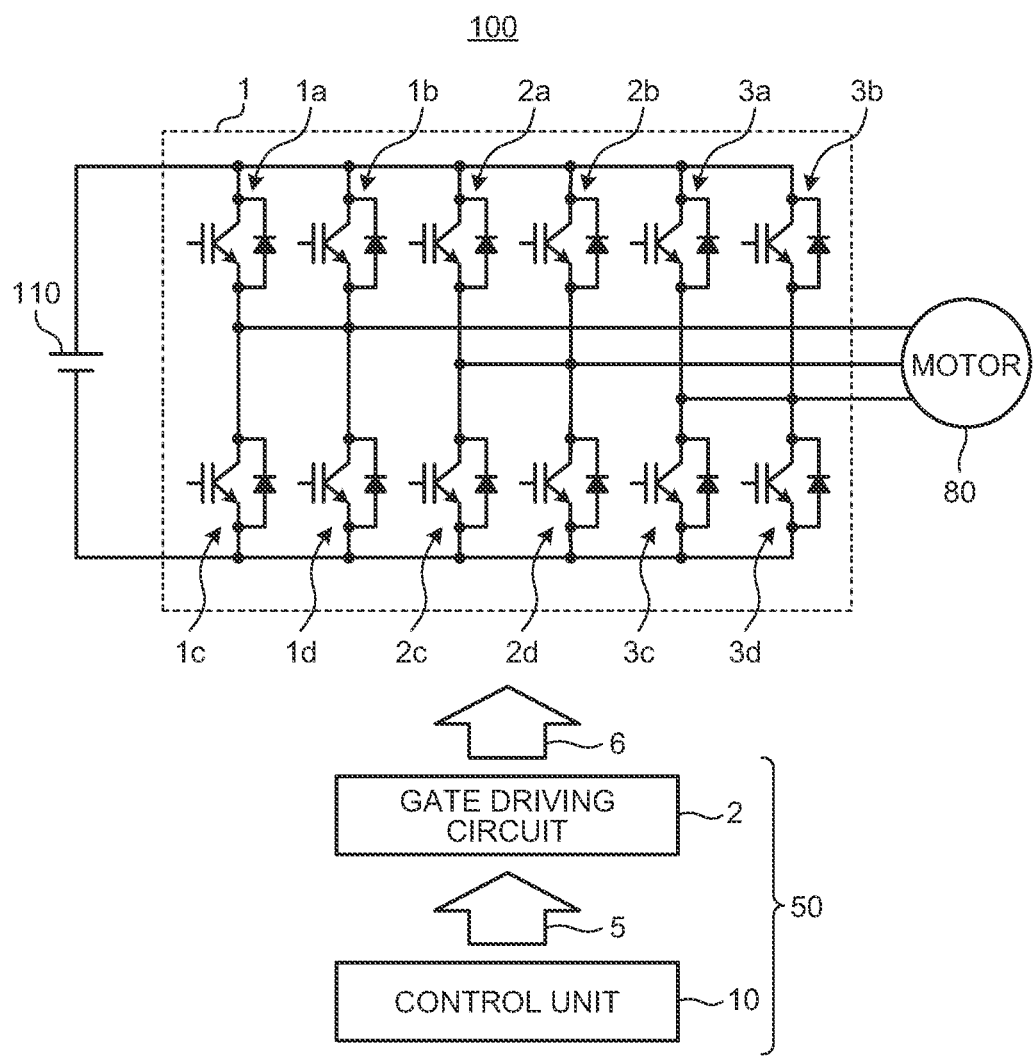
FIG. 1 is a diagram illustrating a configuration example of a power conversion device including a parallel driving device according to a first embodiment.
Figure 2:
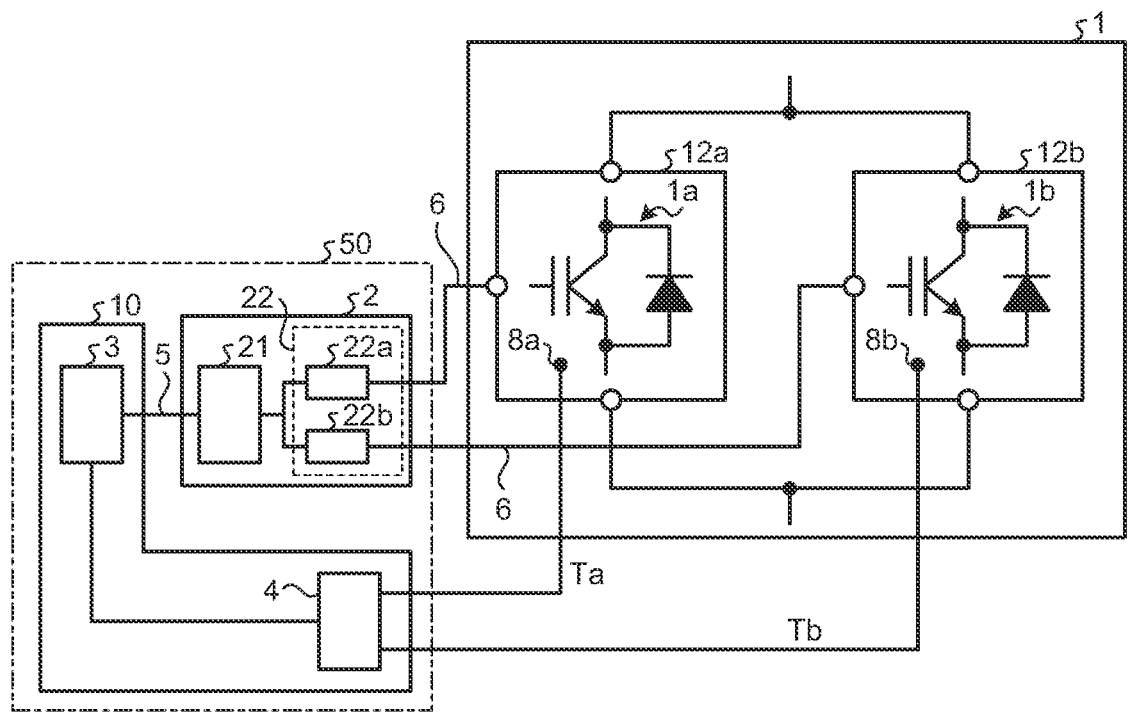
FIG. 2 is a diagram illustrating a detailed configuration of the parallel driving device according to the first embodiment along with semiconductor elements that are targets to be driven.

FIG. 1 is a diagram illustrating a configuration example of a power conversion device 100 including a parallel driving device 50 according to a first embodiment. FIG. 2 is a diagram illustrating a detailed configuration of the parallel driving device 50 according to the first embodiment along with semiconductor elements 1a and 1b that are targets to be driven.

In FIG. 1, the power conversion device 100 according to the first embodiment includes an inverter circuit 1 and the parallel driving device 50. A DC power supply 110 is a source of DC-power to apply a DC voltage to the inverter circuit 1. The DC power supply 110 can be a converter that converts an AC voltage output from an external AC power supply (not illustrated) to a DC voltage. The inverter circuit 1 is a power conversion circuit to convert DC power supplied from the DC power supply 110, into AC power. The inverter circuit 1 is provided with semiconductor elements 1a, 1b, 1c, 1d, 2a, 2b, 2c, 2d, 3a, 3b, 3c, and 3d. A motor 80, which is a load, is connected to output terminals of the inverter circuit 1. The motor 80 is driven with AC power supplied from the inverter circuit 1. Examples of the motor 80 include an induction motor or a synchronous motor.

In the inverter circuit 1, the semiconductor element 1a and the semiconductor element 1b are connected in parallel to form a U-phase upper arm, while the semiconductor element 1c and the semiconductor element 1d are connected in parallel to form a U-phase lower arm. The term "upper arm" indicates a semiconductor element or a group of semiconductor elements connected to the positive side or higher potential side of the DC power supply 110. The term "lower arm" indicates a semiconductor element or a group of semiconductor elements connected to the negative side or lower potential side of the DC power supply 110. A circuit having the upper and lower arms connected in series is referred to as "leg".

The same applies to a V-phase and a W-phase. Similarly, as described below, the semiconductor element 2a and the semiconductor element 2b are connected in parallel to form a V-phase upper arm, while the semiconductor element 2c and the semiconductor element 2d are connected in parallel to form a V-phase lower arm. The semiconductor element 3a and the semiconductor element 3b are connected in parallel to form a W-phase upper arm, while the semiconductor element 3c and the semiconductor element 3d are connected in parallel to form a W-phase lower arm.

The inverter circuit 1 is a three-phase inverter circuit including three legs each having the series-connected upper and lower arms for the corresponding phase.

A diode is connected in inverse parallel to each of the semiconductor elements 1a to 1d, 2a to 2d, and 3a to 3d. FIG. 1 illustrates Insulated Gate Bipolar Transistors (IGBTs) as examples of the semiconductor elements. However, the semiconductor elements are not limited thereto. Metal-Oxide-Semiconductor Field-Effect Transistors (MOSFETs) instead of the IGBTs can be used as the semiconductor elements.

The parallel driving device 50 is a device that drives a plurality of parallel-connected semiconductor elements. The parallel driving device 50 includes a gate driving circuit 2 that is a driving circuit, and a control unit 10. The control unit 10 generates a control signal 5 for controlling each of the semiconductor elements 1a to 1d, 2a to 2d, and 3a to 3d, and outputs the control signal 5 to the gate driving circuit 2. On the basis of the control signal 5, the gate driving circuit 2 generates a driving signal 6 for driving each of the semiconductor elements 1a to 1d, 2a to 2d, and 3a to 3d, and outputs the driving signal 6 to the inverter circuit 1. FIG. 1 illustrates an example case where the target to be driven by the parallel driving device 50 is a three-phase inverter circuit. However, the target is not limited thereto. The target to be driven by the parallel driving device 50 can be a single-phase inverter circuit including two legs, or a half-bridge circuit including a single leg.

For ease of explanation, FIG. 2 illustrates only some of the units of the inverter circuit 1, the gate driving circuit 2, and the control unit 10, the illustrated units being relevant to the description of the outline of the first embodiment. Specifically, the control unit 10 includes a gate control unit 3 and a temperature difference calculator 4. The gate driving circuit 2 includes a first driving circuit 21 and a second driving circuit 22. The second driving circuit 22 includes a first circuit 22a and a second circuit 22b. The semiconductor element 1a is accommodated in a module 12a. The semiconductor element 1b is accommodated in a module 12b. In the module 12a, a temperature sensor 8a to detect the temperature of the semiconductor element 1a is provided. In the module 12b, a temperature sensor 8b to detect the temperature of the semiconductor element 1b is provided.

Although it is most desirable to detect the temperature of an on-chip diode as a temperature of the semiconductor element itself, the temperature to detect can be the temperature of a substrate having a semiconductor element installed thereon, or the temperature of a heat sink having a module attached thereto. To sum up, temperatures of any sections that can determine a difference in temperature between a plurality of semiconductor elements can be detected.

Figure 3:
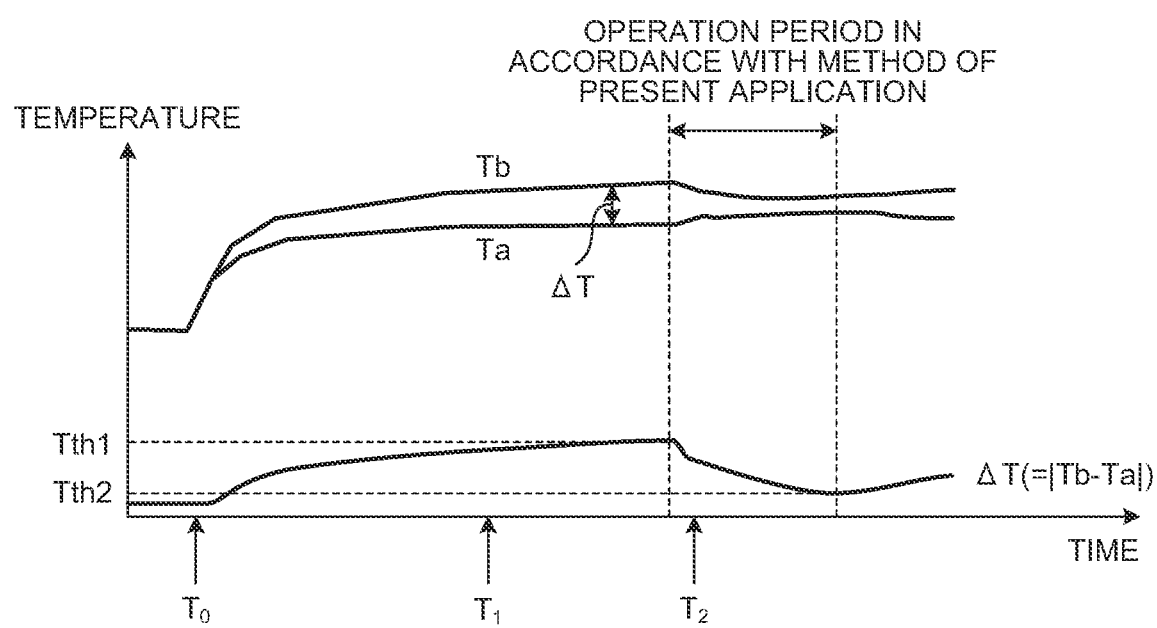
FIG. 3 is a time chart for explaining operation of the relevant parts in the first embodiment.

Next, the operation of the parallel driving device 50 according to the first embodiment is described with further reference to FIGS. 3 and 4 in addition to FIG. 2. FIG. 3 is a time chart for explaining operation of the relevant parts in the first embodiment. FIG. 4 shows waveform diagrams illustrating the operating state of the semiconductor elements 1a and 1b at three time points of the time chart illustrated in FIG. 3.

The temperature sensor 8a detects the temperature of the semiconductor element 1a. The temperature sensor 8b detects the temperature of the semiconductor element 1b. A detected value Ta by the temperature sensor 8a and a detected value Tb by the temperature sensor 8b are input to the temperature difference calculator 4. The temperature difference calculator 4 calculates an absolute value |Tb−Ta| that is a difference between the detected value Tb and the detected value Ta. This absolute value |Tb−Ta| is represented as ΔT. ΔT is referred to as "temperature difference". Information about the temperature difference ΔT is transmitted to the gate control unit 3. The gate control unit 3 generates the control signal 5 on the basis of the temperature difference ΔT. The control signal 5 includes a signal for generating a voltage to be applied to the motor 80 to drive the motor 80, and in addition, includes a signal for changing the timing at which to turn on a particular semiconductor element.

On the basis of the control signal 5 input to the gate driving circuit 2, the gate driving circuit 2 changes the timing at which to turn on the semiconductor element 1a or the semiconductor element 1b. For example, a semiconductor element having been determined to have a relatively high temperature is driven in accordance with the driving signal 6 for delaying the turn-on timing, while a semiconductor element having been determined not to have a relatively high temperature is driven in accordance with a normal driving signal 6 without a delay control.

A signal generated by the first driving circuit 21 is applied to a gate of the semiconductor element 1a through the first circuit 22a of the second driving circuit 22, and is also applied to a gate of the semiconductor element 1b through the second circuit 22b of the second driving circuit 22. The first circuit 22a and the second circuit 22b can be configured in any manner. An example of the configuration is described as follows. Each of the first circuit 22a and the second circuit 22b includes a non-delay circuit to allow a first driving signal generated by the first driving circuit 21 to pass through the non-delay circuit without a delay, and a delay circuit to delay the first driving signal generated by the first driving circuit 21 and output a second driving signal that is the delayed first signal. These non-delay circuit and delay circuit are connected in parallel to each other. Normally, a driving signal is output via the non-delay circuit. When a semiconductor element is determined to have a relatively high temperature, a driving signal is output via the delay circuit.

The time chart in FIG. 3 illustrates a state in which the temperature difference between the semiconductor elements 1a and 1b increases with the lapse of time. The upper portion of the time chart illustrates variations in the detected values Ta and Tb of temperatures of the semiconductor elements 1a and 1b detected by the temperature sensors 8a and 8b, respectively. The lower portion of the time chart illustrates a variation in the temperature difference ΔT calculated by the temperature difference calculator 4. The time chart shows three time points $T_0$, $T_1$, and $T_2$ on the horizontal axis representing time to distinguish whether the semiconductor elements 1a and 1b are in the initial state immediately after the start of operation, or in the state after the lapse of a certain time period, or in the state in which the above delay control is active with the increasing temperature difference increased.

Each of FIGS. 4A to 4C illustrates a gate voltage Vge to be applied to the gate of each of the semiconductor elements 1a and 1b, a collector-emitter voltage Vce to be applied between a collector and an emitter of each of the semiconductor elements 1a and 1b, and a collector current Ic flowing to the collector of each of the semiconductor elements 1a and 1b. Each of FIGS. 4A to 4C illustrates the operating waveform of the semiconductor element 1a with the dotted line, and illustrates the operating waveform of the semiconductor element 1b with the solid line.

In the initial state immediately after the start of operation, as illustrated in FIG. 4A, there is hardly any difference between the operating waveforms of the semiconductor elements 1a and 1b. In contrast, after a certain period of time has elapsed since the start of operation of the inverter circuit 1, a temperature difference between the semiconductor elements 1a and 1b is caused by various factors. In general, when a semiconductor has a higher temperature, a current flows through the semiconductor more easily. In FIG. 3, at and around the time $T_1$, the semiconductor element 1b has a higher temperature than that of the semiconductor element 1a. As a result, as illustrated in FIG. 4B, the collector current Ic is higher in the semiconductor element 1b than in the semiconductor element 1a although the gate voltage Vge is equal in both the semiconductor elements 1a and 1b. In view of the above, in the first embodiment, when the temperature difference ΔT exceeds a first threshold that is a threshold Tth1, the semiconductor element 1b is driven by using a method of the present application. For the purpose of specifying the semiconductor element 1b with the temperature difference ΔT having exceeded the threshold Tth1, the semiconductor element 1b in this state is sometimes referred to as "first semiconductor element".

FIG. 4C illustrates the operating waveform during the operation period in accordance with the method of the present application. During the operation period in accordance with the method of the present application, the delay circuit in the second circuit 22b operates, so that the semiconductor element 1b having a higher temperature is delayed in being turned on. Due to this operation, a current flows only through the semiconductor element 1a during a certain period of time since the semiconductor element 1a is turned on. For this reason, the current distribution is concentrated on the semiconductor element 1a having a lower temperature. As a result, while a loss in the semiconductor element 1a increases, a loss in the semiconductor element 1b decreases. Accordingly, the temperature difference ΔT decreases, and consequently the temperature balance between the semiconductor elements 1a and 1b is maintained. Thereafter, when it is observed that the temperature difference ΔT has decreased below the second threshold that is a threshold Tth2, the operation returns to a normal operation. The threshold Tth2 is set to reduce the fluctuation of the operation. The value of the threshold Tth2 is smaller than that of the threshold Tth1. When the temperature difference ΔT exceeds the threshold Tth1 again after the operation has returned to the normal operation, the method of the present application is activated. Each time the temperature difference ΔT exceeds the threshold Tth1, the method of the present application is activated. Since no turn-on loss occurs in a semiconductor element delayed in being turned on, the temperature of this semiconductor element decreases more than the semiconductor element having been turned on earlier. For this reason, the temperature difference between the semiconductor elements 1a and 1b is reduced, and consequently the temperature balance between the semiconductor elements 1a and 1b can be maintained. This configuration also extends the power cycle life of the semiconductor elements 1a and 1b, and accordingly can improve the reliability of the semiconductor elements 1a and 1b. Further, this configuration can simplify a cooler that cools the semiconductor elements 1a and 1b, and thus can contribute to a reduction in costs of the power conversion device.

The above descriptions have been made for the case where the semiconductor elements 1a and 1b of the U-phase upper arm are driven. The same control is also executed when the semiconductor elements 1c and 1d of the U-phase lower arm are driven. The same applies to the V-phase and the W-phase. The method of the present application is also applied individually and independently to the upper arm and the lower arm for the U, V, and W-phases. This enables the inverter circuit 1 provided with a plurality of semiconductor elements to maintain the temperature balance between the semiconductor elements 1a and 1b simply and autonomously without executing complicated control.

FIG. 1 illustrates an example case where each of the upper and lower arms for each of the U, V, and W-phases forming the inverter circuit 1 has the two parallel-connected semiconductor elements. However, the number of parallel-connected semiconductor elements is not limited to two. Each of the upper and lower arms for each of the U, V, and W-phases can have three or more parallel-connected semiconductor elements. In a case where the number of parallel-connected semiconductor elements is equal to or larger than three, temperature differences among these semiconductor elements can be detected. Alternatively, a temperature difference between the maximum temperature and the minimum temperature of the semiconductor elements can be detected. Alternatively, a temperature difference between the maximum temperature of a semiconductor element and the average temperature of all semiconductor elements can be detected. In these cases, the first semiconductor element can be defined as a semiconductor element having the maximum temperature with the temperature difference exceeding the threshold.

As described above, the parallel driving device according to the first embodiment generates a control signal for changing the timing at which to turn on the first semiconductor element specified from a plurality of semiconductor elements on the basis of a temperature difference between the semiconductor elements. Then, the parallel driving device generates a first driving signal for driving the semiconductor elements, and generates a second driving signal that is the first driving signal delayed on the basis of the control signal, and applies the second driving signal to the first semiconductor element. This can maintain the temperature balance between the semiconductor elements and minimize an increase in loss in the semiconductor element, as well.

The method according to the first embodiment delays turning on a semiconductor element having a higher temperature only when the temperature difference exceeds a threshold, and drives all of the parallel-connected semiconductor elements together when the temperature difference does not exceed the threshold. As a result, an increase in the conduction loss can be minimized as compared to the technique disclosed in Patent Literature 1 in which the on-duty element and the off-duty element are alternately driven.

Second Embodiment

FIG. 5 is a diagram illustrating the detailed configuration of a parallel driving device 50A according to a second embodiment along with the semiconductor elements 1a and 1b that are targets to be driven. In FIG. 5, in the parallel driving device 50A according to the second embodiment, the gate driving circuit 2, included in the parallel driving device 50 according to the first embodiment illustrated in FIG. 2, is replaced with a gate driving circuit 2A. In the gate driving circuit 2A, the first driving circuit 21 is replaced with a driving circuit 23 having a voltage variable function. Other configurations are the same as or identical to those of the first embodiment, the same or identical constituent elements are denoted by like reference signs, and redundant explanations thereof are omitted.

Figure 6:
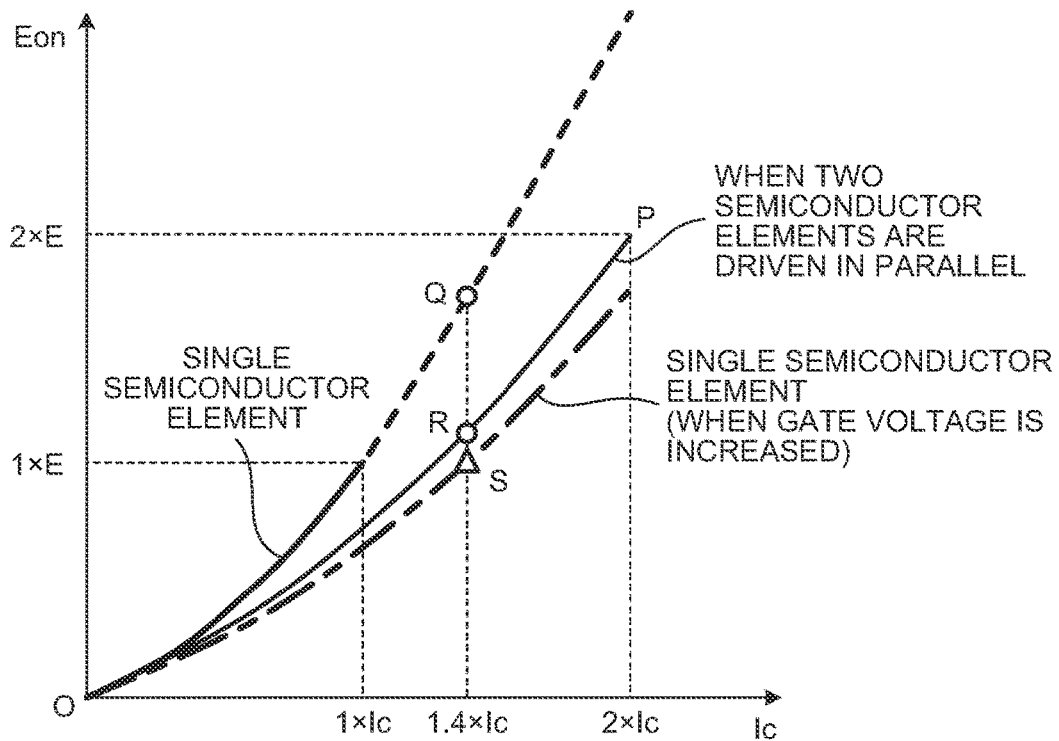
FIG. 6 is a diagram illustrating loss characteristics of a semiconductor element for explaining operation of the parallel driving device according to the second embodiment.

FIG. 6 is a diagram illustrating loss characteristics of a semiconductor element for explaining operation of the parallel driving device 50A according to the second embodiment. In FIG. 6, the horizontal axis represents the collector current Ic, while the vertical axis represents a turn-on loss Eon. That is, FIG. 6 illustrates dependence of the turn-on loss Eon in a general semiconductor element on the current. In FIG. 6, the thick solid curve shows the loss characteristics of a single semiconductor element, and is a downward convex curve. The horizontal axis and the vertical axis in FIG. 6 are normalized. The turn-on loss relative to the rated current "1×Ic" is expressed as "1×E". In FIG. 6, the thin solid curve shows the loss characteristics when two semiconductor elements are connected in parallel. Since the two semiconductor elements connected in parallel operate simultaneously, the current that flows through the two semiconductor elements is twice a current flowing when a single semiconductor element operates. For this reason, the loss curve for the two semiconductor elements connected in parallel is a downward convex curve interconnecting the origin O and the point P. At the point P, the double turn-on loss "2×E" is provided relative to the current "2×Ic" that is twice the rated current.

The first embodiment delays turning on the specified, first semiconductor element on the basis of the temperature difference ΔT, thereby maintaining the temperature balance. As discussed above, dependence of the turn-on loss Eon in a general semiconductor element on the current is shown by the downward convex curve.

Accordingly, as illustrated in FIG. 6, the loss curve for two semiconductor elements connected in parallel has a characteristic of being located below the loss curve for a single semiconductor element. Consider carrying a current of "0.7× Ic" through each semiconductor element in driving the two semiconductor elements in parallel. When these two semiconductor elements are not driven in parallel, a current of "1.4×Ic" flows through the one semiconductor element. In the case of the two semiconductor elements not being driven in parallel, thus, the operation point is represented as "Q". In contrast, when the two semiconductor elements are driven in parallel, the operation point is represented as "R". It is thus understood that the turn-on loss is lower when the semiconductor elements are driven in parallel. Conversely, in the case of carrying equal currents through the semiconductor elements, the turn-on loss increases when the semiconductor elements are not driven in parallel, as compared to when the semiconductor elements are driven in parallel.

In view of the above, the second embodiment proposes a method to reduce the turn-on loss by setting a positive bias voltage of the gate (hereinafter, "gate voltage") higher than the normal value in delaying turning on a semiconductor element having a higher temperature. The gate voltage is varied by the driving circuit 23 having a voltage variable function illustrated in FIG. 5. The gate voltage is varied when the temperature difference ΔT is in excess of the threshold Tth1. The gate voltage is varied for both the semiconductor elements 1*a* and 1*b*.

Figures 7A, 7B, 7C:
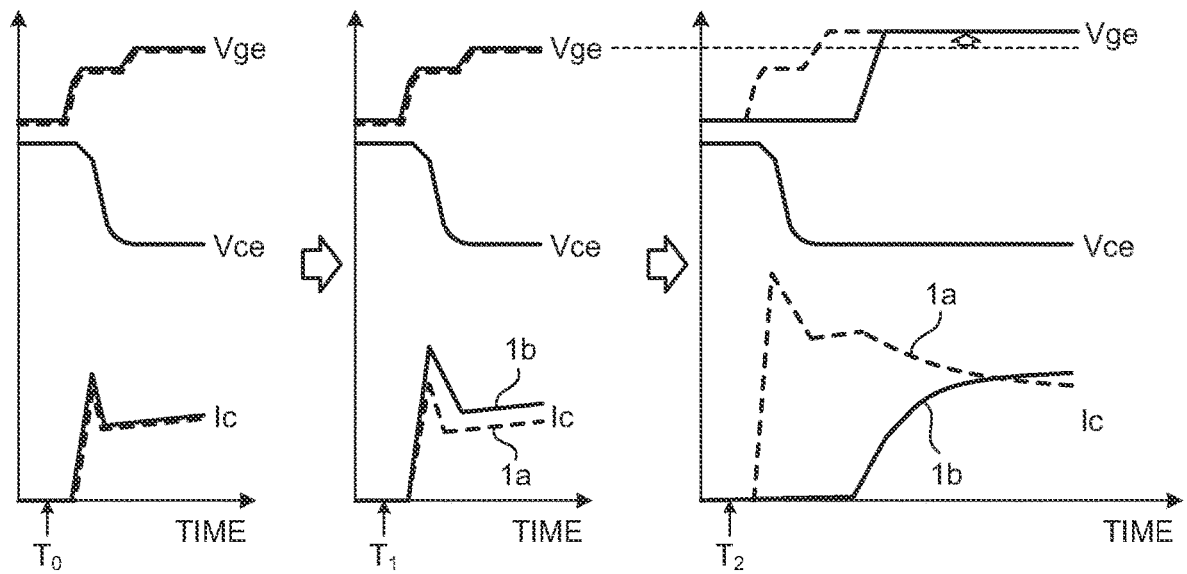
FIG. 7A shows waveform diagrams illustrating the operating state of the semiconductor elements that operate in accordance with a first control method in the second embodiment.
FIG. 7B shows waveform diagrams illustrating the operating state of the semiconductor elements that operate in accordance with a first control method in the second embodiment.
FIG. 7C shows waveform diagrams illustrating the operating state of the semiconductor elements that operate in accordance with a first control method in the second embodiment.

Each of FIGS. 7A to 7C shows waveform diagrams illustrating the operating state of the semiconductor elements 1*a* and 1*b* that operate in accordance with a first control method in the second embodiment. There are various possible timings at which to vary the gate voltage. In the second embodiment, the gate voltage is varied simultaneously with the timing at which to turn on the semiconductor element. FIG. 7C illustrates the operating waveform when the gate voltage is varied. The operating waveforms illustrated in FIGS. 7A and 7B are identical to those illustrated in FIGS. 4A and 4B.

It is preferable to select the value of gate voltage in such a manner as to provide a loss curve lying below the loss curve of FIG. 6 for the two semiconductor elements driven in parallel. An example of that loss curve thus provided is shown with the dot-and-dash line in FIG. 6. On the loss curve shown with the dot-and-dash line, the operation point is represented as "S" when the current of "1.4×Ic" flows. It is thus understood that the turn-on loss at the operation point "S" is decreased relative to that at the operation point "R" when the semiconductor elements are driven in parallel.

When the gate voltage is varied simultaneously with the timing at which to turn on the semiconductor element, the turn-on speed increases as compared to when the gate voltage is not varied. Accordingly, the effect of further reducing the turn-on loss is obtained. The effect of reducing the conduction loss is also obtained by setting the gate voltage higher than the normal value.

Figure 8A:
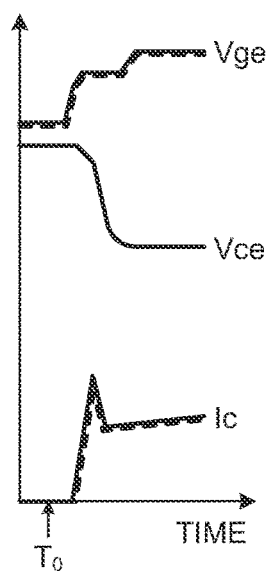
FIG. 8A shows waveform diagrams illustrating the operating state of the semiconductor elements that operate in accordance with a second control method in the second embodiment.
Figure 8B:
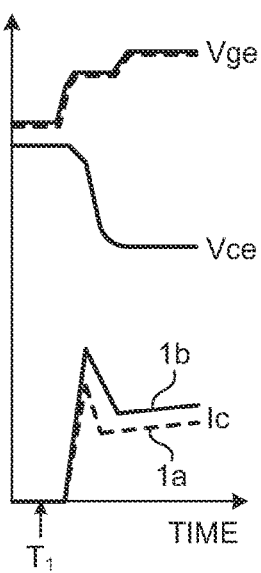
FIG. 8B shows waveform diagrams illustrating the operating state of the semiconductor elements that operate in accordance with a second control method in the second embodiment.
Figure 8C:
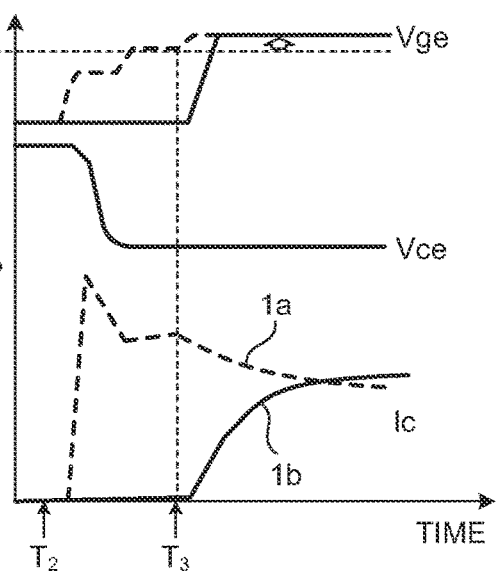
FIG. 8C shows waveform diagrams illustrating the operating state of the semiconductor elements that operate in accordance with a second control method in the second embodiment.

Each of FIGS. 8A to 8C shows waveform diagrams illustrating the operating state of the semiconductor elements 1*a* and 1*b* that operate in accordance with a second control method in the second embodiment. In the second control method, as illustrated in FIG. 8C, the gate voltage is increased after the turn-on period ends. The operating waveforms illustrated in FIGS. 8A and 8B are identical to those illustrated in FIGS. 4A and 4B and 7A and 7B.

In a case where the gate voltage is increased at the turn-on timing, there is a possibility that the current may exceed the maximum turn-on current, and then the overcurrent detection function may become active, or the semiconductor elements may be subjected to an unintentional stress. In contrast, when the gate voltage is increased after the turn-on period ends, then the increase in the turn-on speed can be minimized. As a result, the effect of reducing the conduction loss is obtained, and preventing the turn-on current from exceeding the maximum value, as well.

As described above, the parallel driving device according to the second embodiment includes the driving circuit according to the first embodiment with a voltage variable function added. When the first semiconductor element has been specified, at the time of applying the first and second driving signals to the semiconductor elements, the driving circuit having a voltage variable function increases the voltage level of the first and second driving signals at the timing at which to turn on the semiconductor elements, such that the voltage level becomes higher than the voltage level of the first and second driving signals when the first semiconductor element has not been specified. As a result, the effects of reducing the turn-on loss and the conduction loss can be obtained.

In the parallel driving device according to the second embodiment, when the first semiconductor element has been specified, at the time of applying the first and second driving signals to the semiconductor elements, the driving circuit having a voltage variable function increases the voltage level of the first and second driving signals after the semiconductor element is turned on, such that the voltage level becomes higher than the voltage level of the first and second driving signals when the first semiconductor element has not been specified. As a result, the effect of reducing the conduction loss can be obtained.

Third embodiment.

As described in the second embodiment, dependence of the turn-on loss in a semiconductor element on the current is shown by a downward concave curve. This characteristic is often observed in general when a driving circuit referred to as "constant-voltage driving circuit" is used. The turn-on loss decreases as the turn-on speed is higher. The turn-on loss increases as the turn-on speed is lower. One of the characteristics to determine the turn-on speed is a current rising speed. First, the turn-on characteristics of a semiconductor element are described below.

A voltage to be applied to the gate needs to be increased to turn on the semiconductor element. A self arc-extinguishing semiconductor element, which is preferably used as a power semiconductor element, has a parasitic capacitance referred to as "gate capacitance". For the self arc-extinguishing semiconductor element, the gate capacitance is charged to thereby increase the gate voltage. When the gate voltage exceeds a gate threshold voltage Vth, a current starts flowing. The self arc-extinguishing semiconductor element has characteristics of providing a higher current rising speed at the time of turn-on as the gate charging current is larger before the gate voltage reaches the gate threshold voltage Vth.

Figure 9:
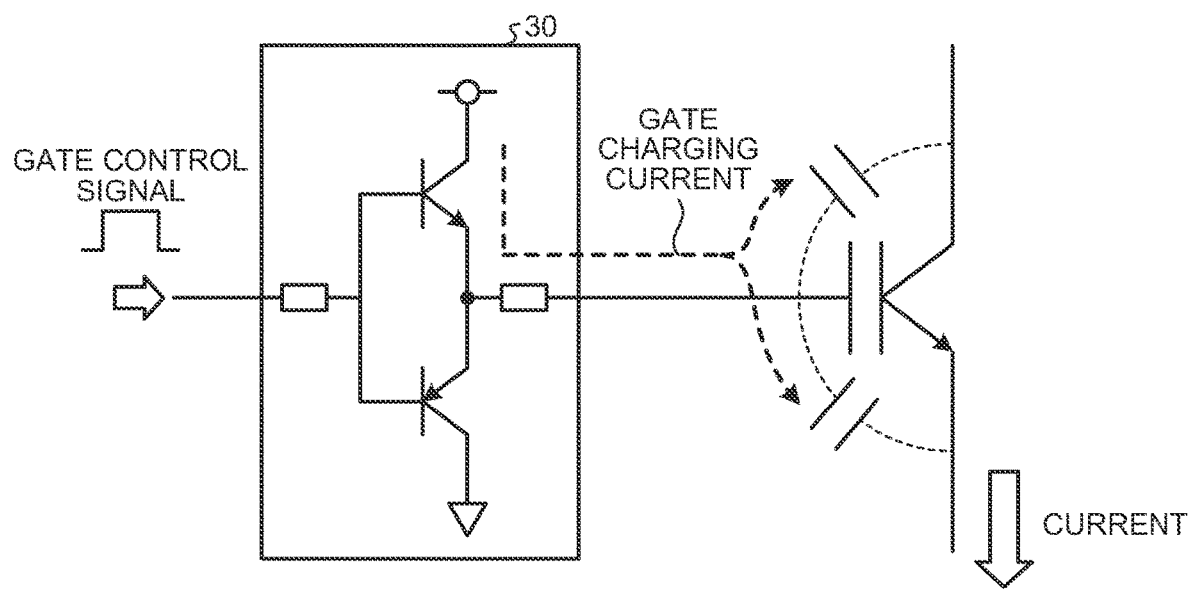
FIG. 9 is a diagram illustrating a configuration example of a general constant-voltage driving circuit.
Figure 10:
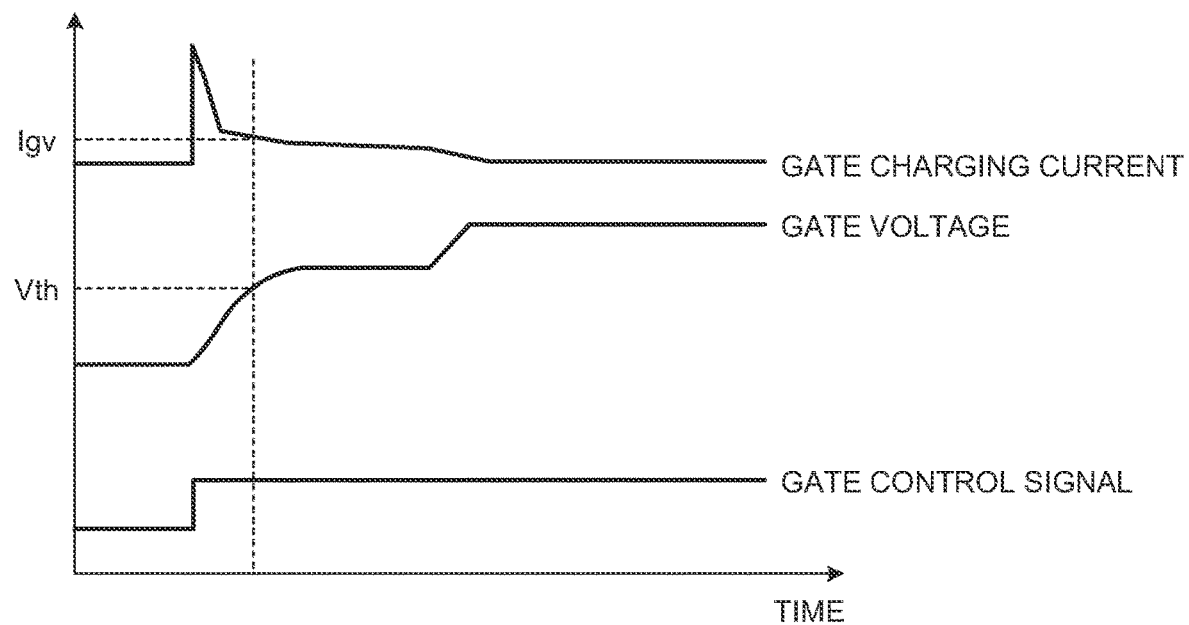
FIG. 10 is a waveform diagram for explaining operation of the constant-voltage driving circuit illustrated in FIG. 9.

FIG. 9 is a diagram illustrating a configuration example of a general constant-voltage driving circuit 30. FIG. 10 is a waveform diagram for explaining operation of the constant-voltage driving circuit 30 illustrated in FIG. 9. The first driving circuit 21 illustrated in FIG. 2 is a component corresponding to the constant-voltage driving circuit 30 illustrated in FIG. 9.

FIG. 10 illustrates a gate charging current, a gate voltage, and a gate control signal in order from the upper portion. In a case where the constant-voltage driving circuit is used, the gate charging current is maximized immediately after the start of application of the gate voltage as illustrated in FIG. 10. In contrast, the gate charging current at and around the gate threshold voltage Vth is relatively low. Due to this characteristic, dependence of the turn-on loss on the current is shown by a downward convex curve as illustrated in FIG.

6. As described in the second embodiment, this characteristic results in an increase in the loss in the inverter circuit in its entirety.

Figure 11:
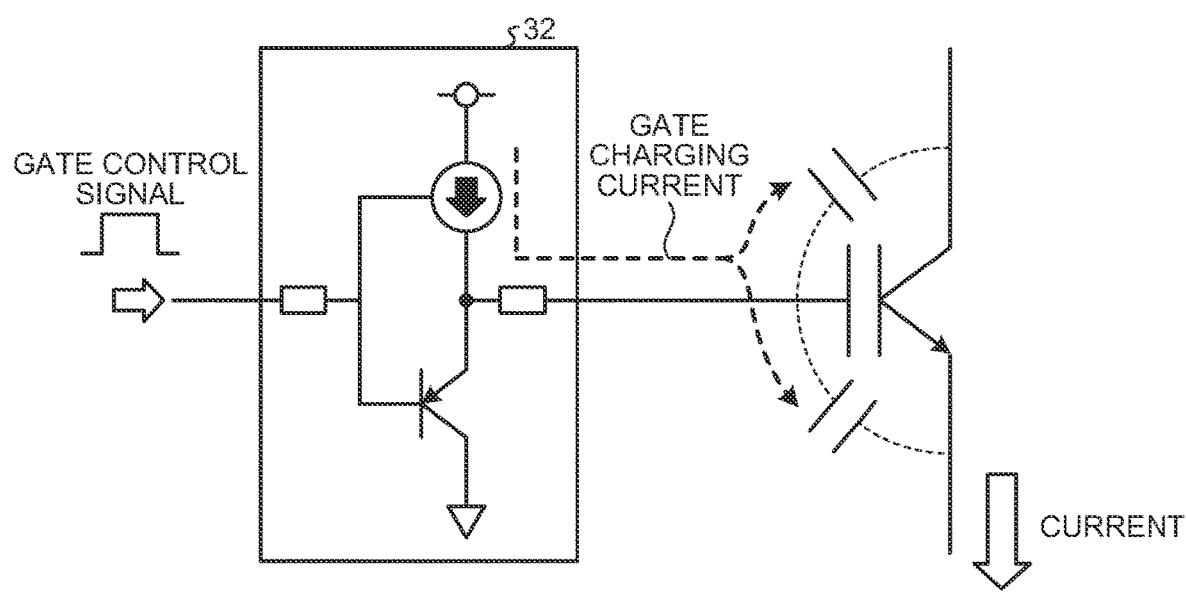
FIG. 11 is a diagram illustrating a configuration example of a constant-current driving circuit in a third embodiment.
Figure 12:
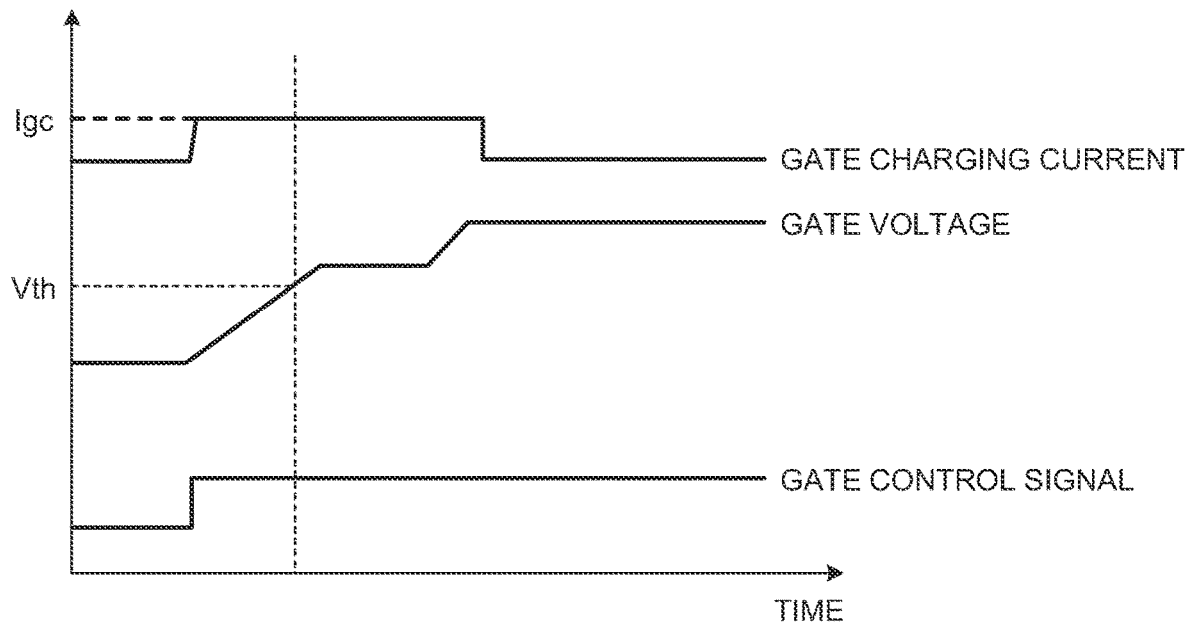
FIG. 12 is a waveform diagram for explaining operation of the constant-current driving circuit illustrated in FIG. 11.

In view of this, the third embodiment uses a driving circuit that provides an upward convex curve showing dependence of the turn-on loss on the current. Specifically, a constant-current driving circuit is used. FIG. 11 is a diagram illustrating a configuration example of a constant-current driving circuit 32 in the third embodiment. FIG. 12 is a waveform diagram for explaining operation of the constant-current driving circuit 32 illustrated in FIG. 11.

FIG. 12 illustrates a gate charging current, a gate voltage, and a gate control signal in order from the upper portion. In a case where the constant-current driving circuit 32 is used, the gate charging current is maintained approximately at a constant value immediately after the start of application of the gate voltage as illustrated in FIG. 12. Thus, a gate charging current Igc flowing from the constant-current driving circuit 32 at and around the gate threshold voltage Vth is higher than a gate charging current Igv flowing from the constant-voltage driving circuit 30 at and around the same gate threshold voltage Vth. At the gate threshold voltage Vth, a self arc-extinguishing semiconductor element is turned on.

Figure 13:
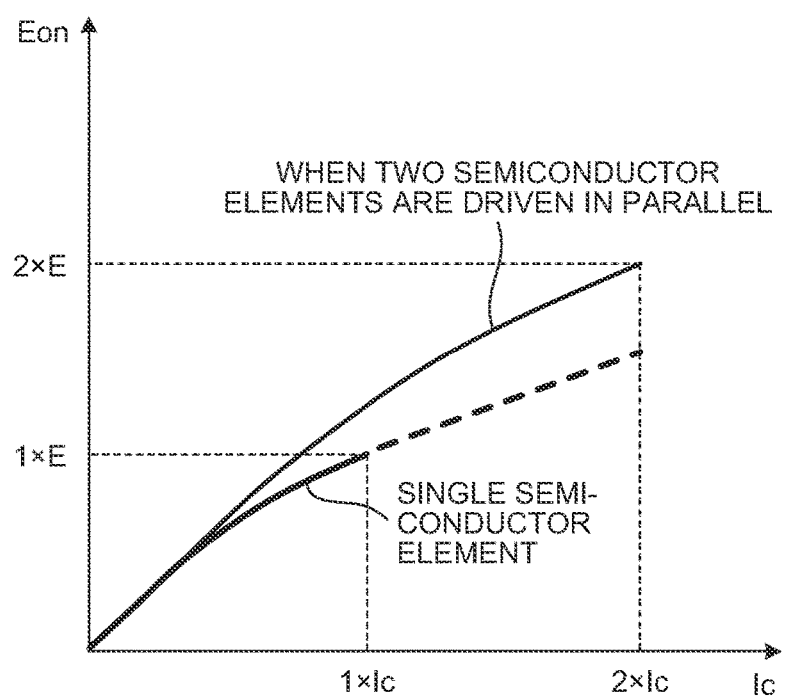
FIG. 13 is a diagram illustrating loss characteristics of semiconductor elements when the semiconductor elements are driven using the constant-current driving circuit in the third embodiment.

FIG. 13 is a diagram illustrating loss characteristics of semiconductor elements when the semiconductor elements are driven using the constant-current driving circuit 32 in the third embodiment. The loss characteristics of the semiconductor elements driven using the constant-current driving circuit 32 are shown by an upward convex curve as illustrated in FIG. 13. Similarly to FIG. 6, the loss characteristic of a single semiconductor element are shown with the thick solid line and the thick dotted line, while the loss characteristic of two semiconductor elements connected in parallel are shown with the thin solid line. Both the loss characteristics are shown by upward convex curves. One of the curves showing the loss characteristic of a single semiconductor element lies below the other curve showing the loss characteristic of two semiconductor elements connected in parallel. In the case of use of the constant-current driving circuit 32, therefore, the turn-on loss does not increase even though the semiconductor element having a lower temperature bears a burden of being turned on as the semiconductor element having a higher temperature is delayed in being turned on. The reasons why the loss characteristics are shown by the upward convex curves can be explained as follows.

For the constant-voltage driving circuit 30, the gate voltage increases in such a manner as to draw an upward convex curve as illustrated in FIG. 10. The reason for this is that the gate capacitance is charged so as to increase in accordance with a time constant CR that is the product of a gate resistance R and a gate capacitance C. In contrast, the constant-current driving circuit 32 has a characteristic of increasing the gate voltage linearly as the gate capacitance is charged with a constant gate current. In general, the rate of increase in the current relative to the increase in the gate voltage, which is regarded as a transmission characteristic of a self arc-extinguishing semiconductor element, is attributable to the characteristics of the self arc-extinguishing semiconductor element.

For the constant-voltage driving circuit 30, the gate voltage increases along an upward convex curve in accordance with the time constant CR. Due to this characteristic, an increase in the gate voltage with respect to time is gentle after the gate voltage exceeds the gate threshold voltage Vth. Accordingly, the rate of increase in the current is so gentle that the current rises slowly. In the constant-current driving circuit 32, in contrast, the gate voltage increases linearly, such that the increase in the gate voltage with respect to time after the gate voltage exceeds the gate threshold voltage Vth is greater than that in the constant-voltage driving circuit 30. Accordingly, the rate of increase in the current becomes higher than that of the constant-voltage driving circuit 30, and the current rises faster accordingly. Thus, the turn-on loss in the constant-current driving circuit 32 is decreased more as the switching current is increased than in the constant-voltage driving circuit 30. That is, the turn-on loss is shown by the upward convex curve as illustrated in FIG. 13.

As explained above, the parallel driving device according to the third embodiment uses the constant-current driving circuit to form the gate driving circuit. Due to this configuration, the effect of further reducing the loss in the inverter circuit in its entirety can be obtained.

Figure 14:
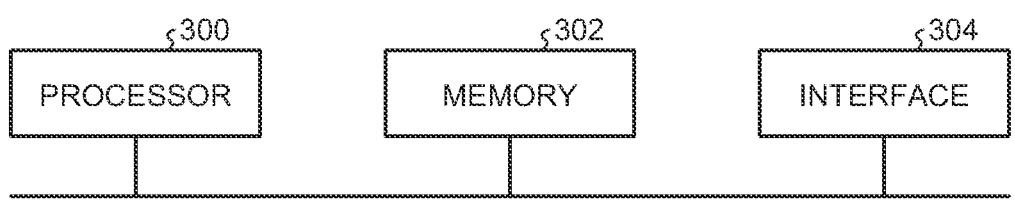
FIG. 14 is a block diagram illustrating an example of the hardware configuration to implement functions of the control unit in the first to third embodiments.
Figure 15:
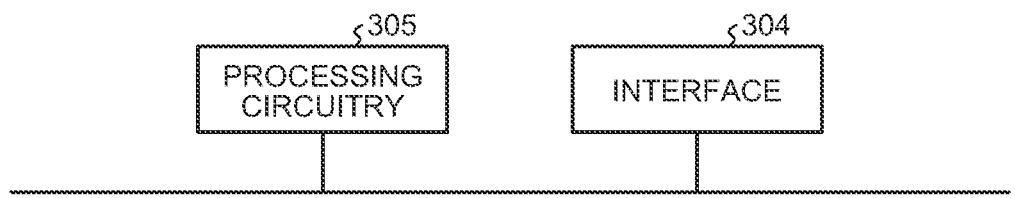
FIG. 15 is a block diagram illustrating another example of the hardware configuration to implement the functions of the control unit in the first to third embodiments.

Next, the hardware configuration to implement the functions of the control unit 10 according to the first to third embodiments is described with reference to the drawings of FIGS. 14 and 15. FIG. 14 is a block diagram illustrating an example of the hardware configuration to implement the functions of the control unit 10 in the first to third embodiments. FIG. 15 is a block diagram illustrating another example of the hardware configuration to implement the functions of the control unit 10 in the first to third embodiments.

In order to implement the functions of the control unit 10 according to the first to third embodiments, as illustrated in FIG. 14, the hardware configuration can be configured to include a processor 300 to perform calculation, a memory 302 to store therein programs to be read by the processor 300, and an interface 304 through which a signal is input/output.

The processor 300 may be calculation means such as a calculation device, a microprocessor, a microcomputer, a CPU (Central Processing Unit), or a DSP (Digital Signal Processor). As the memory 302, a nonvolatile or volatile semiconductor memory such as a RAM (Random Access Memory), a ROM (Read Only Memory), a flash memory, an EPROM (Erasable Programmable ROM), and an EEPROM® (Electrically EPROM), a magnetic disk, a flexible disk, an optical disk, a compact disk, a MiniDisk, and a DVD (Digital Versatile Disk) can be exemplified.

The memory 302 has stored therein programs that execute the functions of the control unit 10 according to the first to third embodiments. The processor 300 transmits or receives necessary information through the interface 304, executes the programs stored in the memory 302, references tables stored in the memory 302, and can thereby perform the processing described above. Results of the calculation performed by the processor 300 can be stored in the memory 302.

The processor 300 and the memory 302 illustrated in FIG. 14 can be replaced with a processing circuitry 305. A single circuit, a combined circuit, an ASIC (Application Specific Integrated Circuit), an FPGA (Field-Programmable Gate Array) or a combination thereof corresponds to the processing circuitry 305. Information to be input to or output from the processing circuitry 305 can be transmitted or received through the interface 304.

The configurations described in the above embodiments are only examples of the content of the present invention. The configurations can be combined with other well-known techniques, and part of each of the configurations can be omitted or modified without departing from the scope of the present invention.

REFERENCE SIGNS LIST 1 inverter circuit; 1a to 1d, 2a to 2d, 3a to 3d semiconductor element; 2, 2A gate driving circuit; 3 gate control unit; 4 temperature difference calculator; 5 control signal; 6 driving signal; 8a, 8b temperature sensor; 10 control unit; 12a, 12b module; 21 first driving circuit; 22 second driving circuit; 22a first circuit; 22b second circuit; 23 driving circuit with voltage variable function; 30 constant-voltage driving circuit; 32 constant-current driving circuit; 50, 50A parallel driving device; 80 motor; 100 power conversion device; 110 DC power supply; 300 processor; 302 memory; 304 interface; 305 processing circuitry.

The invention claimed is:

1. A parallel driving device to drive a plurality of parallel-connected semiconductor elements, the parallel driving device comprising:
a controller to detect a temperature difference between the semiconductor elements on a basis of detected values provided by temperature sensors, the temperature sensors detecting temperatures of the individual semiconductor elements, and to generate a control signal for changing a timing at which to turn on a first semiconductor element specified from the semiconductor elements on the basis of the temperature difference; and
a driving circuit to generate a first driving signal for driving the semiconductor elements, and to generate a second driving signal that is the first driving signal delayed on the basis of the control signal and apply the second driving signal to the first semiconductor element, wherein
the driving circuit is a driving circuit having a voltage variable function or a constant-current driving circuit.

2. The parallel driving device according to claim 1, wherein
when the number of the parallel-connected semiconductor elements is two, the temperature difference is a difference in temperature between the two semiconductor elements, and the first semiconductor element is a semiconductor element with the temperature difference exceeding a threshold, and
when the number of the parallel-connected semiconductor elements is equal to or larger than three, the temperature difference is a difference between maximum and minimum temperatures of the semiconductor elements, or is a difference between a maximum temperature of a semiconductor element and an average temperature of all of the semiconductor elements, and the first semiconductor element is the semiconductor element having the maximum temperature with the temperature difference exceeding a threshold.

3. The parallel driving device according to claim 2, wherein when the temperature difference exceeds a threshold, the driving circuit applies the second driving signal to the first semiconductor element, and when the temperature difference decreases to a threshold or smaller, the driving circuit applies the first driving signal to the first semiconductor element.

4. The parallel driving device according to claim 1, wherein the driving circuit is a driving circuit having the voltage variable function, and wherein
when the first semiconductor element is specified,
in applying the first and second driving signals to the semiconductor elements, the driving circuit increases a voltage level of the first and second driving signals at a timing at which to turn on the semiconductor elements, such that the voltage level becomes higher than a voltage level of the first and second driving signals when the first semiconductor element is not specified.

5. The parallel driving device according to claim 1, wherein the driving circuit is a driving circuit having the voltage variable function, and wherein
when the first semiconductor element is specified,
in applying the first and second driving signals to the semiconductor elements, the driving circuit increases a voltage level of the first and second driving signals after the semiconductor element is turned on, such that the voltage level becomes higher than a voltage level of the first and second driving signals when the first semiconductor element is not specified.

6. The parallel driving device according to claim 1, wherein the driving circuit having the voltage variable function is a constant-voltage driving circuit.

7. A power conversion device comprising:
the parallel driving device according to claim 1; and
a power conversion circuit including the semiconductor elements to be driven by the parallel driving device.

* * * * *